(12) United States Patent
Urban et al.

(10) Patent No.: US 6,918,735 B2
(45) Date of Patent: Jul. 19, 2005

(54) HOLDING DEVICE FOR WAFERS

(75) Inventors: Karsten Urban, Jena (DE); Winfried Deutscher, Jena (DE); Joachim Wienecke, Jena (DE)

(73) Assignee: Leica Microsystems Jena GmbH, Jena (DE)

( * ) Notice: Subject to any disclaimer, the term of this patent is extended or adjusted under 35 U.S.C. 154(b) by 18 days.

(21) Appl. No.: 10/362,791

(22) PCT Filed: Apr. 12, 2002

(86) PCT No.: PCT/DE02/01370

§ 371 (c)(1),
(2), (4) Date: Feb. 25, 2003

(87) PCT Pub. No.: WO02/089183

PCT Pub. Date: Nov. 7, 2002

(65) Prior Publication Data

US 2003/0175106 A1 Sep. 18, 2003

(30) Foreign Application Priority Data

Apr. 28, 2001 (DE) .......... 101 21 115

(51) Int. Cl.⁷ .............................. B25J 15/00
(52) U.S. Cl. .............. 414/729; 294/106; 294/902; 414/744.8; 901/14; 901/31
(58) Field of Search .............. 414/729, 744.2, 414/744.8; 901/14, 31; 294/99.1, 106, 902; 269/268

(56) References Cited

U.S. PATENT DOCUMENTS

| 4,694,230 A | * | 9/1987 | Slocum et al. | 318/568.17 |
| 4,695,215 A | * | 9/1987 | Jacoby et al. | 414/223.01 |
| 4,715,637 A | * | 12/1987 | Hosoda et al. | 294/106 X |
| 5,700,046 A | | 12/1997 | Van Doren et al. | |
| 5,759,006 A | * | 6/1998 | Miyamoto et al. | 414/416 |
| 5,807,062 A | | 9/1998 | Schultz et al. | |

* cited by examiner

*Primary Examiner*—Donald W. Underwood
(74) *Attorney, Agent, or Firm*—Simpson & Simpson, PLLC (57) ABSTRACT

The invention relates to a holding device for wafers in an arrangement for wafer inspection, comprising two grippers (11, 12), each of which, in the closed state of the holding device (8), encloses a subsection of the wafer circumference and which are connected to a drive device (27) and, when the latter is driven, the grippers (11, 12) move away from each other for the purpose of opening the holding device (9) and move toward each other for the purpose of closing the holding device (8), and a holding arm (13), on which the two grippers (11, 12) are pivotably mounted.

In this case the holding arm (13) is mounted such that it can rotate about an axis (A) which lies substantially in the plane covered by the wafer (W), so that after a rotation through 180° about the axis (A), a wafer (W) held between the grippers (11, 12) has been turned.

21 Claims, 7 Drawing Sheets

HOLDING DEVICE FOR WAFERS

The invention relates to a holding device for wafers in an arrangement for wafer inspection, comprising two grippers, each of which, in the closed state of the holding device, encloses a subsection of the wafer circumference and which are connected to a drive device and, when the latter is driven, the grippers move away from each other for the purpose of opening the holding device and move toward each other for the purpose of closing the holding device, and comprising a holding arm on which the two grippers are pivotably mounted.

A holding device of this type is disclosed by U.S. Pat. No. 5,700,046 A. The holding device described there is mounted such that it can move and is used for the purpose of holding wafers as they are transferred, for example, from a pick-up station to an inspection station. For this purpose, the holding device can move along a horizontal axis, can be moved up and down and pivoted about an axis at right angles to the transport direction. The transport direction and the direction of the main extent of the wafer always lie in one plane in this case, that is to say the alignment of the two opposite surfaces of the wafer with respect to the transport direction is maintained during the transfer.

During the transfer, the wafer is enclosed in the manner of an arc by the grippers. In the process, the wafer bears only against the intermediate pieces provided on the grippers. In the holding device described in U.S. Pat. No. 5,700,046 A, these are constructed in such a way that the wafer is held flatly only on its unstructured underside or rear side and at points on its circumferential side edge. The intermediate pieces are L-shaped for this purpose. In this case, the wafer rests with its underside or rear side on horizontal legs of the intermediate pieces and is kept centered by means of the vertical legs, which bear against the side edge of the wafer.

U.S. Pat. No. 5,807,062 A discloses an inspection arrangement in which a wafer passes through various inspection stations. Here, in addition to a microinspection station, in which a microscopic examination of the wafer is carried out, a macroinspection station is also provided, in which the wafer is assessed directly visually by an inspector. In this case, it is primarily large-area faults which may be detected, such as scratches or color deviations. Moreover, contaminants, for example dust particles, adhering to the wafer can be detected.

However, since in the inspection arrangement described in U.S. Pat. No. 5,807,062 A the transport direction and the direction for the main extent of the wafer always likewise lie in one plane, that is to say the alignment of the structured upper side and the nonstructured underside of the wafer with respect to the transport direction is maintained during the transfer, and turning of the wafer is not possible with this holding device, it is, however, possible to inspect only that surface of the wafer which faces the inspector or the microscope objective. This is generally the structured upper side of the wafer. From time to time, however, there is an interest in assessing the underside or rear side of the wafer as well.

On this basis, the invention is based on the object of providing a device which permits viewing both of the structured and of the nonstructured surface of a wafer.

To this end, a holding device of the type mentioned at the beginning is proposed in which the holding arm is mounted such that it can rotate about an axis A, which lies substantially in the plane covered by the wafer, so that after a rotation through 180° about the axis, a wafer held between the grippers has been turned.

The axis A should advantageously run approximately centrally between two pivoting bearings for the grippers.

With the aid of the holding device according to the invention, a wafer can be held securely and turned in any desired transport position of the holding device, that is to say in an inspection station or even halfway between two stations, so that it is possible to inspect both the front side and the rear side from a defined viewing station. Since the wafer is held by the grippers only at a side edge, the view of both its surfaces is not restricted or only insignificantly restricted.

The holding device is preferably used in an arrangement for the visual inspection of wafers. This arrangement comprises a transfer station, a macroinspection station and a microinspection station and also a transfer device for transporting a wafer between the individual stations. In this case, the holding device is arranged in the macroinspection station.

Therefore, during a passage of a wafer through the inspection arrangement, both its structured front side and its rear side can be assessed macroscopically.

In this case, it is also necessary to take account of the fact that the wafer must not be put down on its structured front side, since this could lead to damage which would make the wafer unusable. With the holding device, such impairment of the front side during the inspection of the wafer is avoided.

In an advantageous refinement of the invention, the holding arm is mounted such that it can pivot about a further axis B, which runs substantially tangentially with respect to the wafer circumference and intersects the axis A at least approximately at right angles. This makes it possible to pivot the wafer out of its position before turning it. This is advantageous in particular when components of the wafer inspection device could collide with the wafer or the grippers during turning.

The axis A should advantageously run approximately centrally between two pivoting bearings for the grippers.

Such a collision may also be avoided by the holding arm being mounted such that it can be displaced in a rectilinear guide, the displacement direction C intercepting the axes A and B substantially at right angles. It is also possible in this way to lift the wafer out of its original transport plane to such an extent that a collision during turning is avoided.

By means of a combination of the aforementioned possible movements, the movement travel and the pivoting angle may be reduced, as a result of which the time for turning the wafer can be reduced. The movements, that is to say the translation movement and the pivoting movements of the holding arm, are preferably carried out at the same time.

The possibility of a well coordinated movement sequence results if in each case separately driveable drive devices are provided for pivoting the grippers, for turning the wafer by means of rotation about the axis A, for pivoting the holding arm about the axis B and for displacing the holding arm in the displacement direction C.

In a particularly advantageous refinement of the invention, the grippers each have, on their portions facing the wafer circumference, intermediate pieces, of which at least one is shaped geometrically such that the wafer is held only by contact at its circumferential edges. In this way, firstly secure holding of the wafer is ensured, secondly any contact with the front side is avoided. Furthermore, the impairment of the visible surface in particular on the rear side of the wafer as well, remains very low. As a result of the very small contact areas, the risk of transferring particles is also reduced.

In principle, it is possible to construct individual intermediate pieces in such a way that these come into engagement with one circumferential edge and other intermediate pieces come into engagement only with the other circumferential edge of the wafer. However, at least one intermediate piece is preferably provided, which, during gripping, bears against both circumferential edges of the wafer. Such an intermediate piece can, for example, be open in a V shape toward the wafer, the circumferential edges of a wafer that is held resting in the V profile.

Furthermore, it is possible to construct such an intermediate piece as a roller, which is mounted eccentrically on a gripper and can be fixed in a selected angular position. This makes it possible, in a particularly simple manner, to perform an adjustment of the position between the wafers and the grippers.

As a result of the resilient support of at least one intermediate piece on a gripper, firstly secure gripping is ensured, secondly the contraction forces at the points of contact can be managed well, so that damage can be avoided with great certainty.

The resilient support can be provided, for example, via a leaf spring, the intermediate piece being attached to the associated gripper by a leaf spring. This has the advantage that the holding force of the spring is not impaired during turning. Instead, the position of the wafer relative to the grippers is maintained during turning.

Furthermore, it is also possible to prestress the gripper movements themselves resiliently, in order in this way to keep the risk of damage to the circumferential edges of the wafer low, in particular when closing the grippers.

In a further advantageous refinement of the invention, at least one stop is provided between the grippers and the holding arm, which limits the pivoting angle during the gripper movement. The security of the holding device is in particular improved thereby.

In order to ensure secure holding of a wafer in the holding device, in particular even in the event of failure of the operating voltage, a tension spring is provided between the grippers, by means of which the wafer is held between the grippers under elastic tension, even without any drive force.

In a further advantageous refinement of the invention, a sensor for monitoring the presence of a wafer between grippers is provided on at least one gripper. This is advantageous in particular for an automated operating mode of the holding device, in which a wafer is gripped automatically, subsequently turned, then rotated back into its original position and finally released again.

The invention will be explained in more detail below using an exemplary embodiment illustrated in the drawing, in which.

Figure 1:
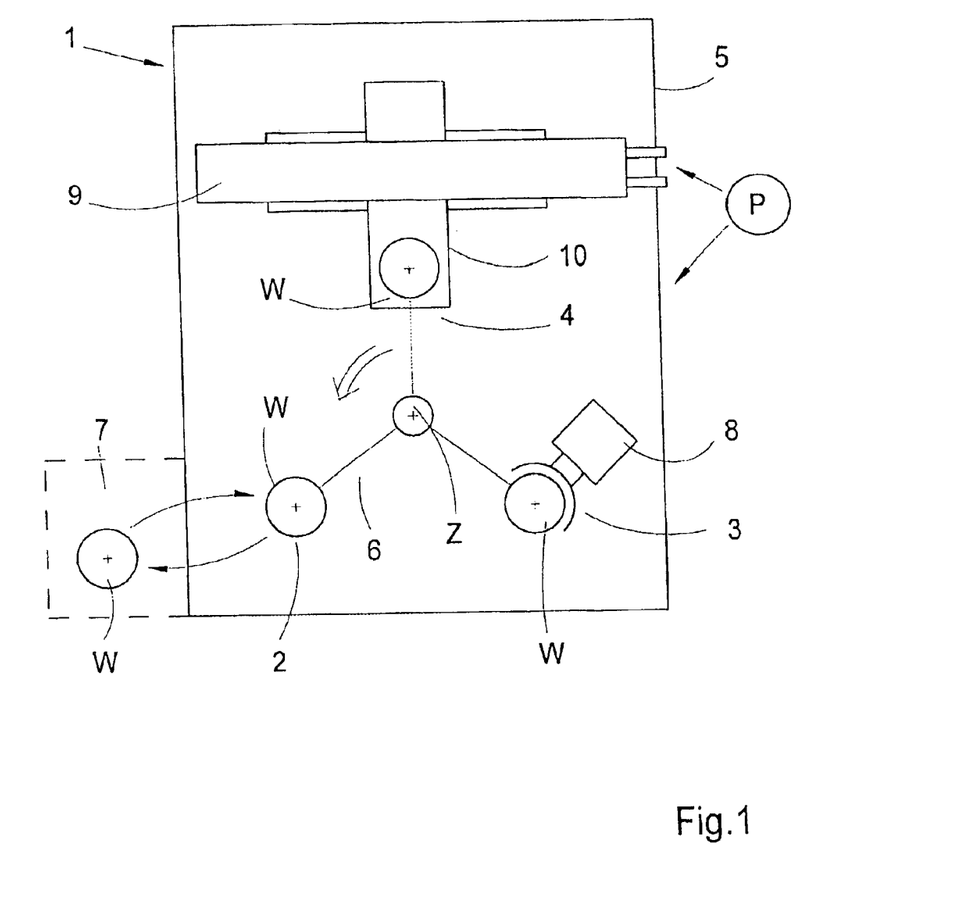
FIG. 1 shows a schematic representation of an inspection arrangement having a holding device for turning a wafer.

The first exemplary embodiment shows, in FIG. 1, an inspection arrangement 1 with which two-dimensional substrates such as wafers W can be examined both directly visually and also microscopically. In particular, by using the inspection arrangement 1, wafers W assessed as faulty during fabrication and separated out may be examined more closely, in order as a result to draw conclusions about the cause of the fault. However, the inspection arrangement can also be used for other examinations.

In the exemplary embodiment illustrated, the inspection arrangement 1 comprises three stations, at which different tasks or preparatory activities are carried out. These three stations, namely a transfer station 2, a macroinspection station 3 and a microinspection station 4 are arranged in a common housing 5, which is closed off to the outside. The individual wafers W are transported between the individual stations 2, 3 and 4 by means of a transfer device 6. Here, the transfer device 6 comprises a star-shaped holder, which rotates about a central axis Z and is stopped at the individual stations.

In the transfer station 2, a wafer W is loaded into the inspection arrangement 1 by means of a transfer device 7, indicated, and is put down on the transfer device 6. From there, with a rotation of the transfer device 6 through 120°, the wafer W passes into the macroinspection station 3. In the latter, an assessment is carried out by means of an inspector P standing or sitting beside the inspection arrangement 1.

In the transfer state, the structure front side of the wafer W points upward, while the unstructured rear side of the wafer W rests on the transfer device 6. After the front side has been viewed, the wafer W is turned, so that the inspector P can also inspect its rear side. For this purpose, a holding device 8 is provided in the macroinspection station 3 and firstly grips the wafer W, lifts it upward off the transfer device 6 and then turns it. Following inspection of the rear side of the wafer, the wafer W is firstly turned back and then put down with the rear side on the transfer device 6 again.

By indexing the transfer device 6 by 120° again, the wafer W passes into the microinspection station 4. Here, the wafer W can be examined in detail, section by section, with a microscope 9. The microscope 9 comprises a moveable table 10, on which the wafer W to be inspected is put down temporarily for the purpose of inspection. After the inspection, the wafer W is transported onward to the transfer station 2, in which the wafer W is removed by means of the transfer device 7. Suitable transfer devices are known to those skilled in the art and therefore do not require any specific explanation. For example, use can be made here of a device as described in U.S. Pat. No. 5,700,046 A.

In the following text, the holding device 8 according to the invention for turning a wafer W, arranged in the macroinspection station 3, is to be explained in more detail.

Figure 2:
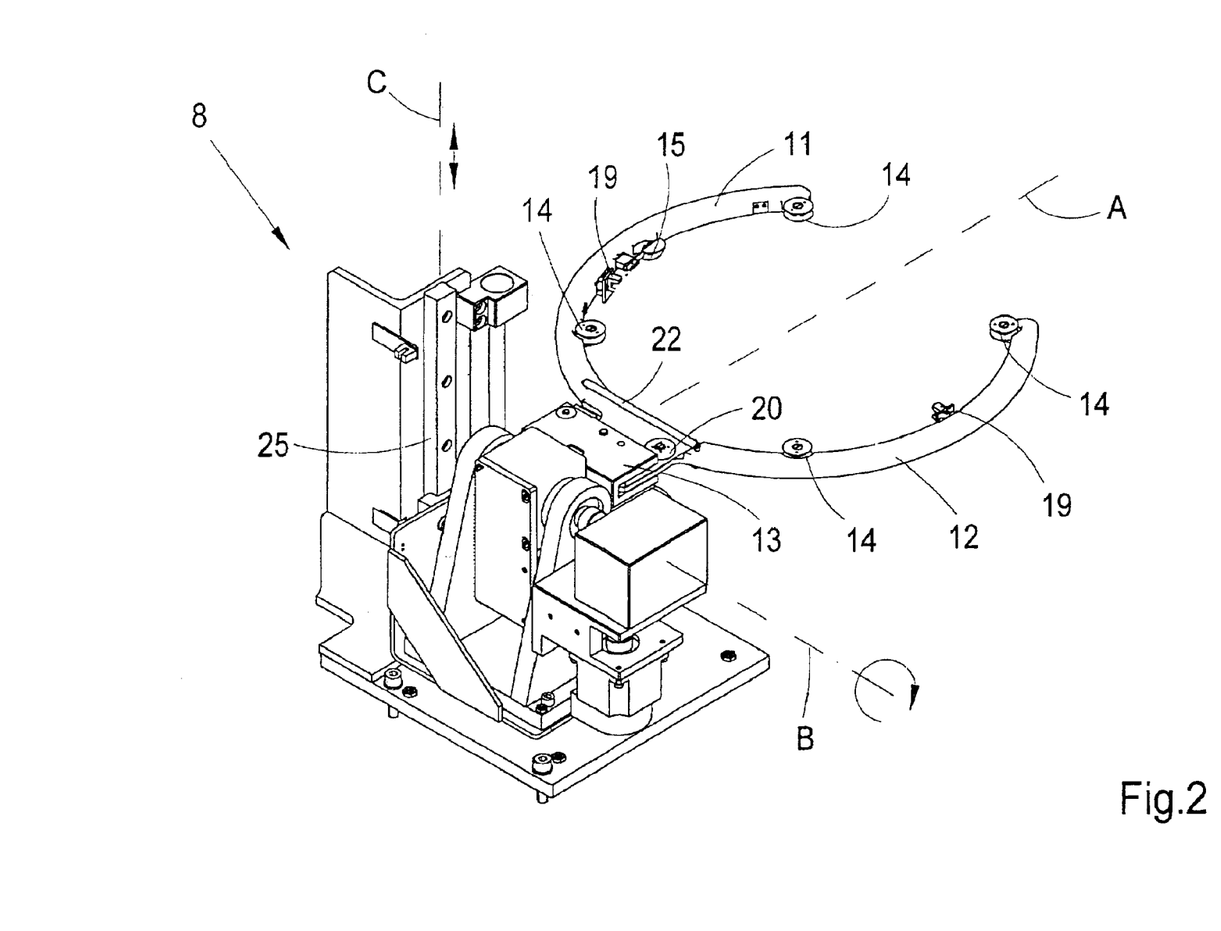
FIG. 2 shows a three-dimensional view of the holding device.

The holding device 8, which is illustrated in detail in FIG. 2, comprises two arc-shaped grippers 11 and 12 which, in terms of their shape, are matched to the diameter of the wafers W to be gripped and enclose about three quarters of the wafer at its side edge. The two grippers 11 and 12 are mounted on a holding arm 13 and can be moved with respect to each other. In order to open them, the grippers 11 and 12 are pivoted away from each other, so that the inner sides of the grippers can be guided to the level of the wafer edge. In order to grip a wafer W, the holding device is closed, that is to say the grippers 11 and 12 are moved toward each other until the latter come into contact with the wafer edge by means of the intermediate pieces 14 and 15.

Figure 7:
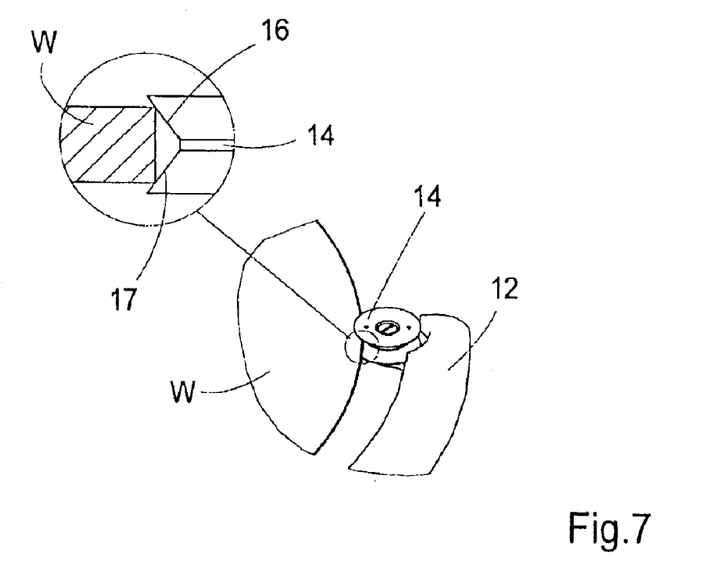
FIG. 7 shows a detailed view of an intermediate piece.

The intermediate pieces 14 and 15 are in this case constructed in such a way that, when they grip a wafer W, they bear only against the circumferential edges at the wafer circumference, as shown in FIG. 7. By this means, firstly secure gripping is ensured, secondly any contact with the structured front side and also the rear side of the wafer W is avoided. Moreover, the area of contact between the contraction elements 14 and 15 and the wafer W remains small, so that as few particles as possible are loosened or transferred when gripping and releasing the wafer W.

In the selected exemplary embodiment, a total of four uniformly distributed intermediate pieces 14 are permanently arranged on the grippers 11 and 12, each being designed in the manner of a roller. When viewed in a plane at right angles to the gripping plane, this roller possesses a wedge-shaped profile which tapers toward the roller center. The two mutually opposite wedge surfaces 16 and 17 in each case bear against a circumferential edge of the wafer W when gripping, and in this way also effect centering of the wafer W in the gripping plane.

The permanently arranged intermediate pieces 10 are in each case mounted eccentrically on the associated gripper 11 or 12. As a result of a rotation, in this way the position of a gripped wafer W relative to the grippers 11 and 12 can be set. After an adjustment has been carried out, the intermediate pieces 14 are fixed in the selected angular position.

Figure 8:
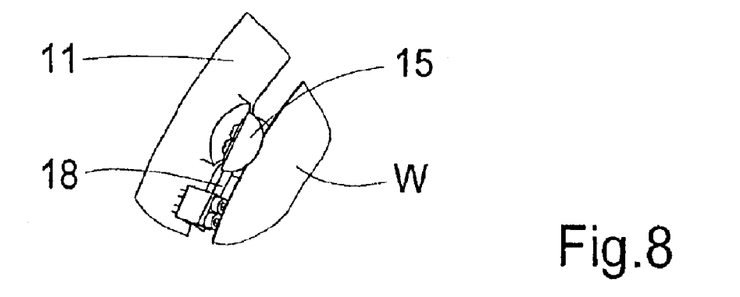
FIG. 8 shows a detailed view of a resilient intermediate piece.

Apart from the stationary intermediate pieces 14, a resilient intermediate piece 15 is also provided, which is shown in detail in FIG. 8. In terms of its shape, this intermediate piece 15 corresponds substantially to half an intermediate piece 14, so that the resiliently mounted intermediate piece 15 can also bear with two wedge surfaces 16 and 17 against the circumferential edges of a wafer W. The intermediate piece 15 is fixed to a leaf spring 18 which, for its part, is in turn fixed to the inner flank of the gripper 11 which points toward the side edge of the wafer W. The leaf spring 18 can be deflected elastically in the gripping plane but, on the other hand, is stiff in a direction at right angles to this. This radial springing permits particularly gentle gripping of a wafer W.

Figure 9:
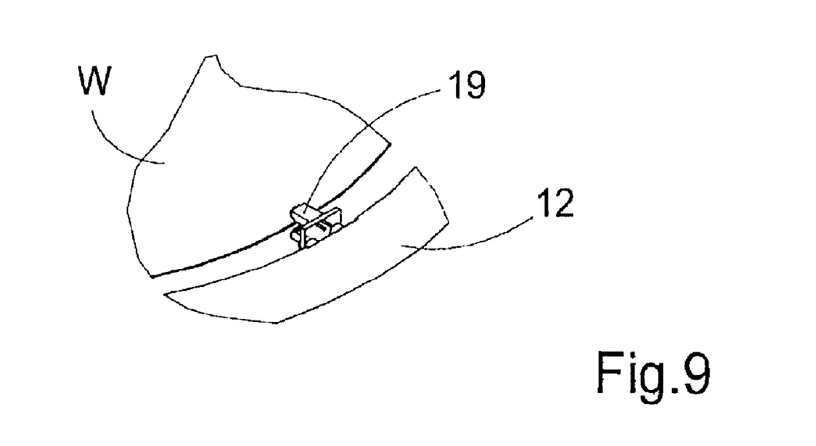
FIG. 9 shows a detailed view of a sensor.

Furthermore, in each case a sensor 19 is fitted to the grippers 11 and 12, with which the presence of a wafer W between the grippers 11 and 12 can be determined. The signal generated by the sensors 19 is evaluated in a control device, not specifically illustrated, in order to permit automated operation of the holding device 8. For example, before a wafer is turned, it is possible to determine whether said wafer has been gripped properly. Moreover, when the wafer W is put down on the transfer device 6 again, it is possible to determine whether, before the grippers 11 and 12 are removed from the wafer W, the latter has also actually been released. The sensors 19 are constructed and arranged accordingly. In the exemplary embodiment illustrated, they are located on the inner flanks of the grippers 11 and 12.

In order to open and close the grippers 11 and 12, they are pivotably mounted on the holding arm 13. The pivoting movement of the grippers 11 and 12 is limited by a stop 20 fitted to the gripper 11. Said stop is illustrated in detail in FIG. 10, which shows a closed position of the grippers 11 and 12. In this closed position, the stop 20 strikes a stop surface 21 on the holding arm 13.

Figure 10:
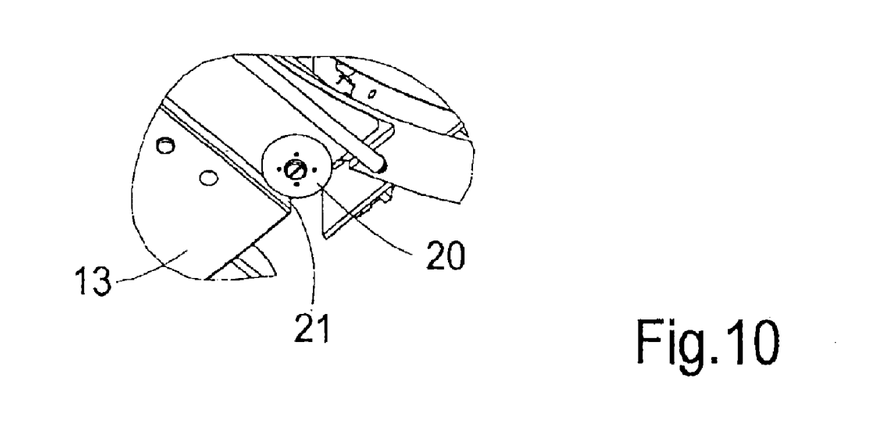
FIG. 10 shows a detailed view of a stop for the grippers.

Arranged beside the stop 20 is a tension spring, which is connected to both grippers 11 and 12 in order to pull the latter into the closed position. This ensures that a wafer W always remains held securely between the wafers 11 and 12.

The opening and closing are carried out by means of a drive device, which is coupled to the grippers 11 and 12.

In order to turn the wafer W, a further drive device is provided, which permits rotation of the wafer through 180° about an axis A. Following a rotation about this turning axis A, the wafer W is substantially in the initial position, but the front side and the rear side have been interchanged. As FIG. 2 shows, the turning axis W runs through the holding arm 13, parallel to or through the gripping plane, and preferably also through the mid-axis M of the wafer W.

The holding arm 13 is in turn pivotably mounted on a bracket 23. The pivot axis B in this case runs transversely with respect to the turning axis A. In the exemplary embodiment illustrated, the pivot axis B runs horizontally and outside a wafer W gripped between the grippers 11 and 12.

The bracket 23 is for its part supported on a base part 24 and guided linearly with respect to the latter in the displacement direction C. The linear guide 25 here permits an upward and downward movement of the brackets 23 and therefore, at the same time, of the holding arm 13 and of the grippers 11 and 12.

Each of the individual movements, that is to say the opening and closing of the grippers 11 and 12, the turning of the holding arm 13 with the grippers 11 and 12 about the turning axis A, the pivoting of the holding arm 13 about the pivot axis B and also the upward and downward movement of the bracket 23 along the displacement direction C, are carried out via a separately controllable drive device. In this case, actuating or stepper motors can be provided, so that the individual movements can be carried out completely independently of one another. The individual drive devices are designated by the designations 26 to 29 in FIGS. 2 to 5.

Figure 3:
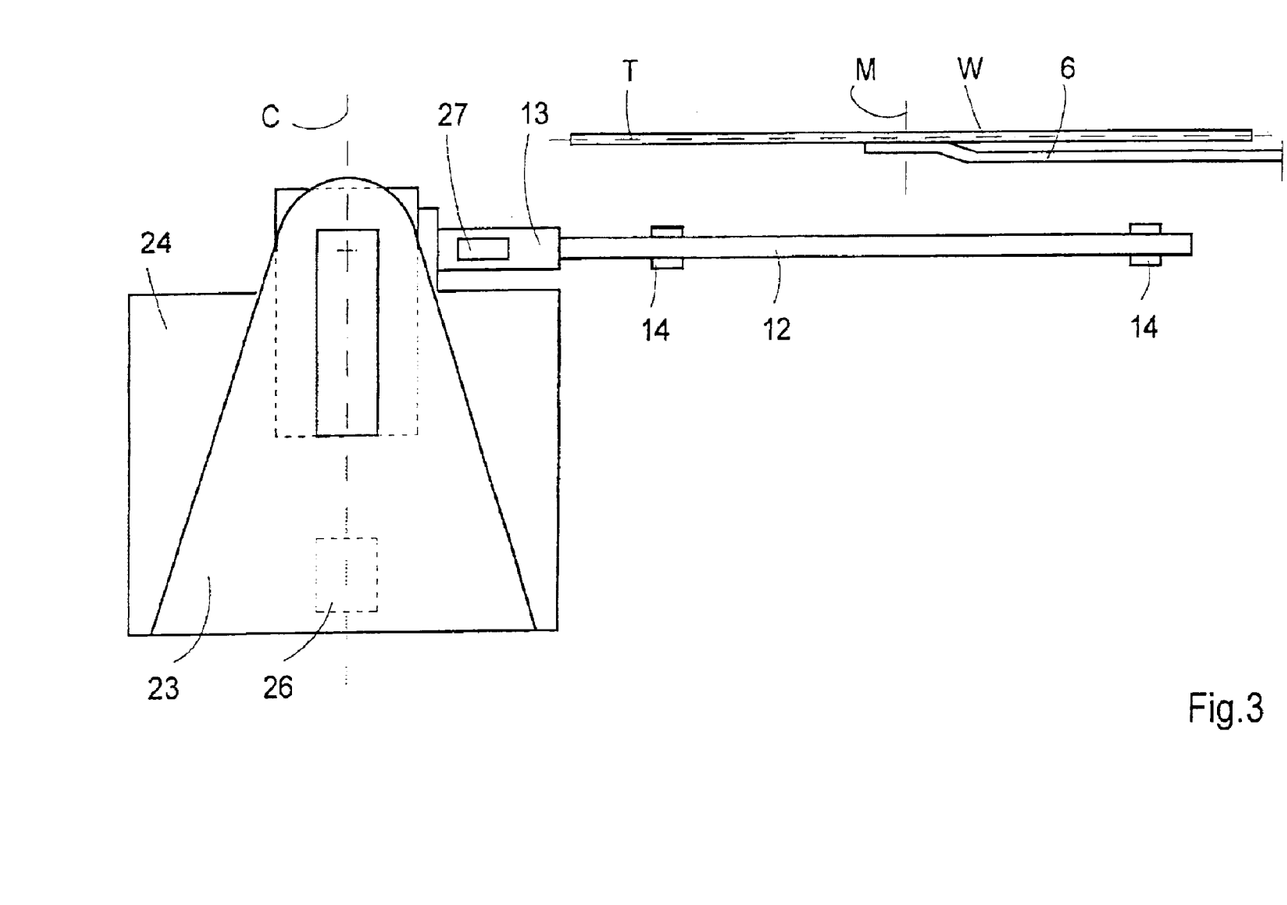
FIG. 3 shows a side view of the holding device in a first position before gripping a wafer.

In the following text, the operating mode of the holding device 8 is now to be explained in more detail using FIG. 3 to FIG. 5. In this case, FIG. 3 shows an initial position, in which a wafer W is conveyed into the macroinspection station 3 in a transfer plane T by means of the transfer device 6. In this case, the grippers 11 and 12 are located in a position underneath the transfer plane T. The gripping plane of the grippers 11 and 12 is aligned approximately parallel to the transfer plane T. In order to grip the wafer W, first of all the drive device 26 is actuated in order to move the bracket 23 along the displacement direction C. Said drive device 26 is constructed as a linear motor 26 here. At the same time, the grippers 11 and 12 are opened as a result of actuation of the associated drive device 27, so that the intermediate pieces 14 and 15 do not collide with the wafer W as they move upward.

The upward movement along the displacement direction C is stopped when the gripping plane coincides with the transfer plane T. By means of renewed actuation of the drive device 27, an electric motor here, the grippers 11 and 12 are moved into the closed position, whereupon the intermediate pieces 14 and 15 are brought into contact with the wafer W and in the process engage around its side edge. This state is illustrated in FIG. 4. When proper gripping of the wafer W is signalled by means of the sensors 19, the drive device 26 is actuated again in order to lift the wafer W off the transfer device 6 and to move it further upward. At the same time, or else with a small time delay, the holding arm 13 is pivoted about the axis B with respect to the bracket 23, as indicated in FIG. 5. For this purpose, the associated drive device 28, which is again constructed as an electric motor, is actuated. The wafer W is moved upward and pivoted about the axis B until the grippers 11 and 12 with the wafer W can be rotated without hindrance about the turning axis A, without colliding with the transfer device 6 in the process.

As a result of the possibility of pivoting about the pivot axis B, the movement travel along the displacement direction C can be kept relatively small. The simultaneity of the two movements makes it possible to quickly reach the position illustrated in FIG. 5 in which the actual turning can then be performed.

The assessment of the rear side of the wafer W can be performed by means of an appropriate alignment of the holding device 8 in this pivoted position, from a viewing space beside the inspection arrangement. For this purpose, the drive device 29 is actuated in order to rotate about the axis A.

Figure 5:
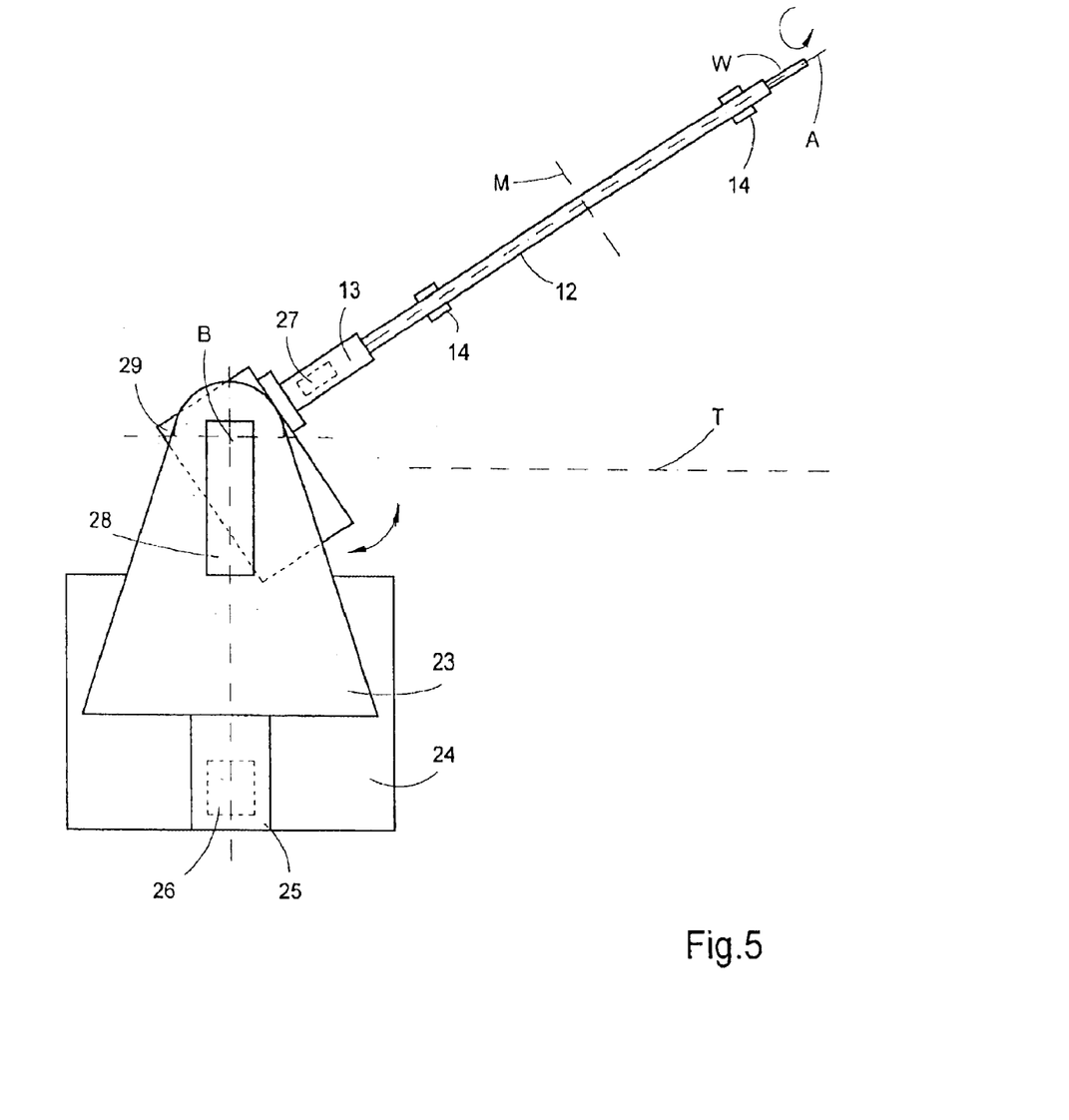
FIG. 5 shows a side view of the holding device in a third position immediately before turning the wafer, in which position the wafer has already been lifted upward and pivoted.
Figure 6:
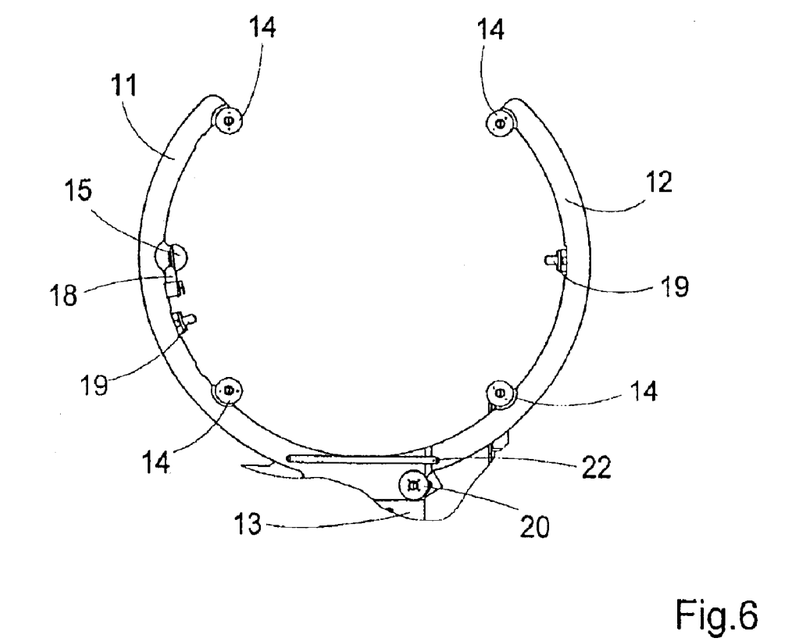
FIG. 6 shows a detailed view of the gripper in the region of the wafer.

By means of a combined pivoting movement about the axes A and B by small angles, a tumbling movement with the wafer W can be carried out in the position illustrated in FIG. 5 and, given appropriate illumination of the wafer W, improves the visual detectability of faults on the wafer W and also dust particles adhering thereto. This tumbling movement can be carried out both for viewing the structured front side and for viewing the rear side.

Figure 4:
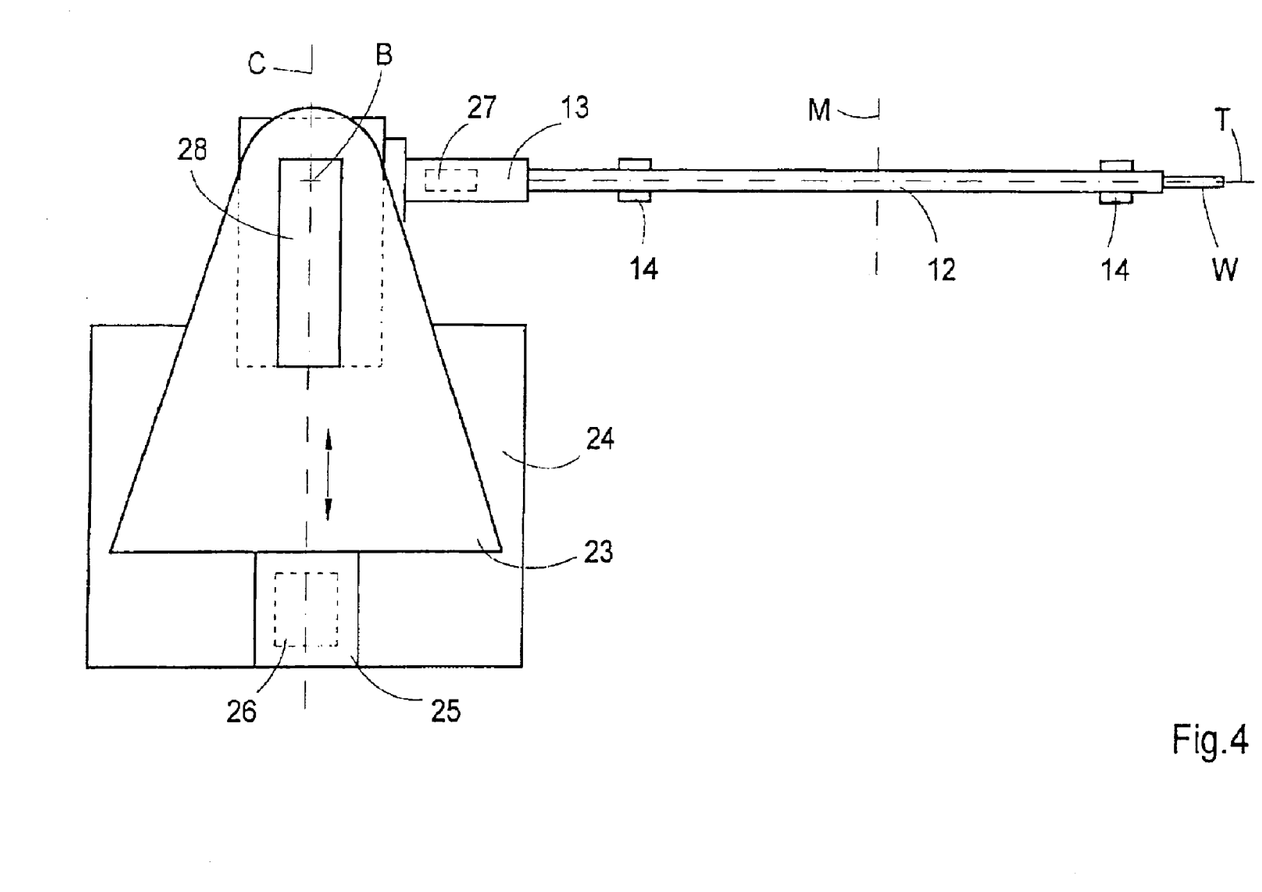
FIG. 4 shows a side view of the holding device in a second position when gripping a wafer.

However, it is also conceivable to move the wafer W back into a position corresponding to FIG. 4, but said wafer is stopped shortly above the transfer device 6, in order not to damage the structured front side of the wafer W. In this way, virtually identical observation conditions can be implemented for the inspection of the front and rear sides. However, this is somewhat more time-consuming than the inspection in the position illustrated in FIG. 5, since the pivoting and lifting movements with respect to the axis B and the displacement direction C then have to be carried out twice.

After the wafer W has been turned back into the position illustrated in FIG. 5, it is then put down with its rear side on the transfer device 6, for which purpose the holding device 8 is moved into the position illustrated in FIG. 4. The wafer is released by opening the grippers 11 and 12. This is also detected by means of the sensors 19. By means of lowering the bracket 23 further, the initial position illustrated in FIG. 3 is then reached, in which the grippers 11 and 12 are pulled back from the transfer plane T and are closed in order to relieve the load on the associated drive device 27.

The holding device explained permits rapid and efficient microscopic inspection of the front and rear sides of a wafer in one operation. As a result of the arrangement in the macroinspection station, the scope of the inspection of an inspection arrangement is increased.

LIST OF DESIGNATIONS

1 Inspection arrangement
2 Transfer station
3 Macroinspection station
4 Microinspection station
5 Housing
6 Transfer device
7 Transfer device
8 Holding device
9 Microscope
10 Table
11 Gripper
12 Gripper
13 Holding arm
14 Intermediate piece
15 Resilient intermediate piece
16 Wedge surface
17 Wedge surface
18 Leaf spring
19 Sensor
20 Stop
21 Stop surface
22 Tension spring
23 Bracket
24 Base part
25 Linear guide
26, 27, 28, 29 Drive devices
W Wafer
R Axis of rotation
A, B Axes
C Displacement direction
M Mid-axis

What is claimed is:

1. A holding device for wafers in an arrangement for wafer inspection, comprising:

two grippers (11, 12), each of which, in the closed state of the holding device (8), encloses a subsection of the wafer circumference and which are connected to a drive device (27) and, when the latter is driven, the grippers (11, 12) move away from each other for the purpose of opening the holding device (9) and move toward each other for the purpose of closing the holding device (8), and a holding arm (13), on which the two grippers (11, 12) are pivotably mounted, wherein the holding arm (13) is mounted such that it can rotate about an axis (A) which lies substantially in the plane covered by the wafer (W), so that after a rotation through 180° about the axis (A), a wafer (W) held between the grippers (11, 12) has been turned; and, wherein said holding arm (13) is mounted such that it pivots about an axis B, which runs substantially tangentially with respect to the wafer (W) circumference and intersects the axis A at least approximately at right angles and wherein said holding arm (13) is mounted such that it is displaced in a rectilinear guide, the displacement direction C intercepting the axes A and B substantially at right angles.

2. The holding device as claimed in claim 1, further comprising two pivot bearings attached to said grippers (11, 12) wherein said axis (A) runs approximately centrally between said two pivoting bearings.

3. The holding device as recited in claim 1, wherein a separate drive device (26, 27, 28, 29) is provided for each of: pivoting the grippers (11, 12); turning the wafer (W) by means of rotation about the axis (A); pivoting the holding arm (13) about the axis (B,); and, displacing the holding arm (13) in the displacement direction (C).

4. The holding device as recited in claim 1, further comprising intermediate pieces (14, 15), said intermediate pieces (14, 15) located on the portions of said grippers (11, 12) facing at least one wafer circumferential edge, at least one of said intermediate pieces (14, 15) shaped geometrically to hold said at least one circumferential edge of said wafer (W).

5. The holding device as recited in claim 4, wherein at least one of said intermediate pieces (14, 15), bears against both circumferential edges of the wafer (W) during gripping.

6. The holding device as recited in claim 5, wherein the at least one intermediate piece (14, 15) is configured in a V shape toward the wafer (W), wherein said both circumferential edges of a wafer (W) are held within the acute angle of the at least one V shaped intermediate piece (14, 15).

7. The holding device as recited in claim 5, wherein at least one intermediate piece (14, 15) is constructed as a roller, said roller being mounted eccentrically on at least one gripper (11, 12) and fixed in a selected angular position.

8. The holding device as recited in claim 5, wherein the at least one of said intermediate pieces (14, 15) is resiliently attached to said gripper (11, 12).

9. The holding device as claimed in claim 8, wherein the at least one resiliently attached intermediate piece (14, 15) is attached to said gripper (11, 12) by a leaf spring (18).

10. The holding device as recited in claim 1, wherein said grippers (11, 12) are resiliently prestressed in their pivoting bearings.

11. The holding device as recited in claim 1, further comprising stops (20), said stops (20) positioned between said grippers (11, 12) and said holding arm (13), wherein said stops (20) limit the pivoting angle during the gripper movement.

12. The holding device as recited in claim 1, further comprising a tension spring (22), said tension spring (22) connecting said grippers (11, 12), wherein said wafer (W) is held between said grippers (11, 12) under elastic tension.

13. The holding device as recited in claim 1, further comprising a sensor (19) on at least one of said grippers (11, 12), wherein said sensor (19) detects the presence of a wafer (W) between the grippers (11, 12).

14. A holding device for wafers in an arrangement for wafer inspection, comprising:

two grippers (11, 12), each of which, in the closed state of the holding device (8), encloses a subsection of the wafer circumference and which are connected to a drive device (27) and, when the latter is driven, the grippers (11, 12) move away from each other for the purpose of opening the holding device (9) and move toward each other for the purpose of closing the holding device (8)

a holding arm (13), on which the two grippers (11, 15 12) are pivotably mounted, and, at least two intermediate pieces (14, 15) located on the portions of said grippers (11, 12) facing at least one wafer circumferential edge, at least one of said intermediate pieces (14, 15) shaped geometrically to hold said at least one circumferential edge of said wafer (W) characterized in that the at least two intermediate pieces (14, 15) are resiliently supported on said gripper (11, 12) by a leaf spring (18);

wherein the holding arm (13) is mounted such that it can rotate about an axis (A) which lies substantially in the plane covered by the wafer (W), so that after a rotation through 180° about the axis (A), a wafer (W) held between the grippers (11, 12) has been turned.

15. The holding device as recited in claim 14, wherein the at least one of said intermediate pieces (14, 15) bears against both circumferential edges of the wafer (W).

16. The holding device as recited in claim 15 wherein the at least one intermediate piece (14, 15) bearing against both circumferential edges of the wafer (W) is configured in a V shape toward the wafer, wherein said both circumferential edges of the wafer (W) are held within the acute angle of said at least one V shaped intermediate piece (14, 15).

17. The holding device as recited in claim 14 wherein at least one intermediate piece (14, 15) is constructed as a roller, said roller being mounted eccentrically on at least one gripper (11, 12) and fixed in a selected angular position.

18. The holding device as recited in claim 14, wherein said holding arm (13) is mounted such that it can pivot about a further axis (B), said further axis (B) extending substantially tangentially with respect to a wafer (W) circumference and intersecting the axis (A) at least approximately at right angles.

19. The holding device as recited in claim 18, wherein the at least one of said intermediate pieces (14, 15) bears against both circumferential edges of the wafer (W).

20. The holding device as recited in claim 19 wherein the at least one intermediate piece (14, 15) bearing against both circumferential edges of the wafer (W) is configured in a V shape toward the wafer, wherein said both circumferential edges of the wafer (W) are held within the acute angle of said at least one V shaped intermediate piece (14, 15).

21. The holding device as recited in claim 18 wherein at least one intermediate piece (14, 15) is constructed as a roller, said roller being mounted eccentrically on at least one gripper (11, 12) and fixed in a selected angular position.

* * * * *

UNITED STATES PATENT AND TRADEMARK OFFICE
CERTIFICATE OF CORRECTION

PATENT NO.   : 6,918,735 B2
DATED        : July 19, 2005
INVENTOR(S)  : Karsten Urban, Winfried Deutscher and Joachim Wienecke It is certified that error appears in the above-identified patent and that said Letters Patent is hereby corrected as shown below:

Column 9,
Line 33, please delete the number "15".
Line 36, please delete the word "gripper" and insert the term -- said two grippers. --.

Signed and Sealed this

Fourth Day of October, 2005

JON W. DUDAS
*Director of the United States Patent and Trademark Office*